United States Patent
Arase et al.

(10) Patent No.: US 7,326,509 B2
(45) Date of Patent: Feb. 5, 2008

(54) COMPOSITION FOR FORMING ANTI-REFLECTIVE COATING FOR USE IN LITHOGRAPHY

(75) Inventors: Shinya Arase, Funabashi (JP); Takahiro Kishioka, Nei-gun (JP); Ken-ichi Mizusawa, Chiyoda-ku (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 0 days.

(21) Appl. No.: 10/486,891

(22) PCT Filed: Aug. 13, 2002

(86) PCT No.: PCT/JP02/08244

§ 371 (c)(1),
(2), (4) Date: Feb. 17, 2004

(87) PCT Pub. No.: WO03/017002

PCT Pub. Date: Feb. 27, 2003

(65) Prior Publication Data

US 2004/0197709 A1  Oct. 7, 2004

(30) Foreign Application Priority Data

Aug. 20, 2001 (JP) .............................. 2001-248878

(51) Int. Cl.
*G03C 1/00* (2006.01)
*G03F 7/26* (2006.01)
(52) U.S. Cl. .................................. 430/270.1; 430/322
(58) Field of Classification Search ............ 430/270.1, 430/311, 313, 322, 323, 330, 950
See application file for complete search history.

(56) References Cited

U.S. PATENT DOCUMENTS 4,521,570 A * 6/1985 Watanabe et al. ........... 525/415

(Continued)

FOREIGN PATENT DOCUMENTS

EP  0 698 823 A1  2/1996

(Continued)

OTHER PUBLICATIONS

Tom Lynch et al.; "Properties and Performance of Near UV Reflectivity Control Layers"; SPIE vol. 2195; pp. 225-229.

(Continued)

*Primary Examiner*—Kathleen Duda
(74) *Attorney, Agent, or Firm*—Oliff & Berridge PLC

(57) ABSTRACT

There is provided a composition for forming anti-reflective coating for use in a lithography which has a high effect of inhibiting reflected light, causes no intermixing with resist layers, affords excellent resist patterns, has a higher dry etching rate compared with the resist, and has broader margin of depth of focus and higher resolution than the prior compositions.

Concretely, the composition is one for forming anti-reflective coating for use in a lithographic process in manufacture of a semiconductor device, and comprises a resin containing a lactone structure. The resin is one which a γ-lactone structure or a δ-lactone structure is introduced to a main chain thereof or a side chain bonded to the main chain.

9 Claims, 3 Drawing Sheets

EXAMPLE 1

U.S. PATENT DOCUMENTS

| | | | | |
|---|---|---|---|---|
| 5,607,824 | A | 3/1997 | Fahey et al. | 430/510 |
| 5,693,691 | A | 12/1997 | Flaim et al. | 523/436 |
| 5,736,301 | A | 4/1998 | Fahey et al. | 430/325 |
| 5,919,599 | A | 7/1999 | Meador et al. | 430/271.1 |
| 6,020,433 | A * | 2/2000 | Hirano et al. | 525/217 |
| 6,054,254 | A | 4/2000 | Sato et al. | 430/322 |
| 2001/0026901 | A1 | 10/2001 | Maeda et al. | 430/270.1 |
| 2003/0215736 | A1* | 11/2003 | Oberlander et al. | 430/270.1 |

FOREIGN PATENT DOCUMENTS

| | | |
|---|---|---|
| JP | A 6-348036 | 12/1994 |
| JP | A 8-62835 | 3/1996 |
| JP | A 11-72925 | 3/1999 |
| JP | A 2000-26446 | 1/2000 |
| JP | A 2000-98610 | 4/2000 |
| JP | A 2000-100705 | 4/2000 |
| WO | WO00/01684 | 1/2000 |
| WO | WO 00/22229 | 4/2000 |

OTHER PUBLICATIONS

G. Taylor et al.; "Methacrylate Resists and Antireflective Coatings for 193 nm Lithography"; Part of the SPIE Conference on Advances in Resist Technology and Processing XVI; vol. 3678; Mar. 1999; pp. 174-185.

* cited by examiner

COMPOSITION FOR FORMING ANTI-REFLECTIVE COATING FOR USE IN LITHOGRAPHY

TECHNICAL FIELD

The present invention relates to a composition for forming anti-reflective coating, particularly to a composition for reducing a reflection of irradiated light for exposing a photoresist applied on a substrate from the substrate, and more particularly to a composition for forming anti-reflective coating comprising a resin composition effectively absorbing irradiated light for exposure with a wavelength of 248 nm, 193 nm or 157 nm.

BACKGROUND ART

Conventionally, in the manufacture of semiconductor devices, micro-processing by lithography using a photoresist composition has been carried out. The micro-processing is a processing method including forming a thin film of a photoresist composition on a silicon wafer, irradiating actinic rays such as ultraviolet rays through a mask pattern depicting a pattern for a semiconductor device, developing it to obtain a resist pattern, and etching the silicon wafer using the resist pattern as a protective film. However, in recent progress in high integration of semiconductor devices, there has been a tendency that shorter wavelength actinic rays are being used, i.e., ArF excimer laser beam (193 nm) has been taking the place of KrF excimer laser beam (248 nm). Along with this change, influences of random reflection and standing wave off a substrate have become serious problems. Accordingly, it has been widely studied to provide an anti-reflective coating between the photoresist and the substrate (Bottom Anti-Reflective Coating, BARC).

As the anti-reflective coating, inorganic anti-reflective coatings made of titanium, titanium dioxide, titanium nitride, chromium oxide, carbon or α-silicon and organic anti-reflective coatings made of a light-absorbing substance and a high molecular compound are known. The former requires an installation such as a vacuum deposition apparatus, a CVD (chemical vapor deposition) apparatus or a sputtering apparatus. In contrast, the latter is considered advantageous in that it requires no special installation so that many studies have been made. For example, mention may be made of the acrylic resin type anti-reflective coating having a hydroxyl group being a crosslinking reaction group and a light absorbing group in the same molecule as disclosed in U.S. Pat. No. 5,919,599 and the novolak resin type anti-reflective coating having a hydroxyl group being a crosslinking reaction group and a light absorbing group in the same molecule as disclosed in U.S. Pat. No. 5,693,691, and so on.

The physical properties desired for organic anti-reflective coating materials include high absorbance to light and radioactive rays, no intermixing with the resist layer (being insoluble in resist solvents), no diffusion of low molecular substances from the anti-reflective coating material into the topcoat resist upon coating or heat-drying, and a higher dry etching rate than the resist. They are described in, for example, Proc. SPIE, Vol. 3678, 174-185 (1999) and Proc. SPIE, Vol. 2195, 225-229 (1994). Further, it has been required that anti-reflective coating materials have a property that the margin of depth of focus can be over a wide range or a property that the resolution can be improved.

The margin of depth of focus means a width of total depth range in which a resist pattern can be kept in a practicable state when a focus is displaced upward or downward from the optimum focus position. The broader the width is, the higher the level of additional coverage in the production process is. For example, one of techniques for improving the margin of depth of focus is disclosed in Japanese Patent Laid-open No. Hei 6-348036.

The production of semiconductors includes a process for forming a resist pattern by selectively exposing a photoresist layer formed on an object to be processed, such as a silicon wafer with light and then developing. During the exposure, the focus of irradiated light for exposure is sometimes displaced for the optimum position. This is caused by curvature of image plane, deterioration in the reproducibility of focus position (detection, stage) or lowering in stability of focus control (heat, environment) from the aspect of manufacturing equipments, and difference in level on devices formed on a wafer, global inclination of a wafer or local unevenness on a wafer from the aspect of wafers, and the like. The above-mentioned displacement from the optimum focus position causes deformation of resist patterns, such as thinned pattern, thereby causing improper forming of resist patterns, such as pattern collapse. Consequently, there causes a problem that resist patterns can not be formed in a high dimensional accuracy. In particular, in a micro-processing with irradiated light having a wavelength of 193 nm, thinned pattern or pattern collapse resulting from displacement from the optimum focus position becomes problems. Under the present status of the art, there is a growing demand for anti-reflective coating materials having a property that can suppress to a low level influence on resist pattern formation due to displacement from the focus of irradiated light for exposure, that is, a property that enables margin of depth of focus to be widen.

Further, with high integration of semiconductor devices, there is a growing demand for anti-reflective coating materials having a higher resolution, that is, a property that makes it possible to form rectangular resist patterns with finer pattern size.

In the meantime, Japanese Patent Laid-open No. Hei 11-72925 proposes a method for forming a resist pattern having a perpendicular side wall and a good rectangular section in order to inhibit any film loss of the resist pattern and to form the resist pattern in a high resolution and high dimensional accuracy. The method comprises forming a pattern by using an undercoat layer composition containing a compound having a substituent which is decomposed by an acid to then afford an alkali-soluble group, and an acid generator which produces the acid, and dissolving and removing exposed portions on the undercoat layer formed from the composition by a developer; or the method comprises forming a pattern by using an undercoat layer composition containing a compound having a substituent which is crosslinked by an acid, and an acid generator which produces the acid, and dissolving and removing unexposed portions on the undercoat layer formed from the composition by a developer.

However, the undercoat layer composition disclosed in the above-mentioned publication is developed for anti-reflective coatings on the assumption that a part of the undercoat layer which a resist thereon is removed by exposure and development is removed by wet etching. Therefore, this can not be necessarily applied as such for a composition for forming anti-reflective coating for pattern forming on the assumption that a part of the undercoat layer which a resist thereon is removed by exposure and development is removed by dry etching, or for such a composition containing a crosslinking agent. It is generally known that performance and properties on micro-processing by lithography in a composition for forming anti-reflective coating containing a crosslinking agent are different from those in a composition for forming anti-reflective coating containing no crosslinking agent. Further, the above-mentioned publication does not propose or suggest concrete improvement measures on margin of depth of focus and high resolution that become problem in resist pattern formation.

Under the above-mentioned circumstances, an object of the present invention is to provide a composition for forming anti-reflective coating that can attain broad margin of depth of focus and high resolution on the assumption that pattern formation is carried out by dry etching.

The present invention provides a composition for forming anti-reflective coating which inhibits efficiently reflection for using it as anti-reflective coating particularly when irradiated light having a wavelength of 193 nm is used in micro-processing, further which improves an adhesion with a photoresist, has broad margin of depth of focus and can attain high resolution. That is, an object of the present invention is to provide a composition for forming anti-reflective coating for use in lithography which has a high prevention effect of reflected light, causes no intermixing with a resist layer, provide an excellent resist pattern and broad margin of depth of focus, and has a higher dry etching rate than resists; and a method for forming resist pattern by using the composition for forming anti-reflective coating.

DISCLOSURE OF THE INVENTION

The present invention relates to the following aspects:

as a first aspect, a composition for forming anti-reflective coating for use in a lithographic process in manufacture of a semiconductor device, comprising a resin having a lactone structure, and a crosslinking agent;

as a second aspect, the composition for forming anti-reflective coating as described in the first aspect, wherein the resin is a resin which a γ-lactone structure or a δ-lactone structure is introduced to a main chain thereof or a side chain bonded to the main chain;

as a third aspect, the composition for forming anti-reflective coating as described in the first aspect, wherein the resin has a structural unit of formula (1):

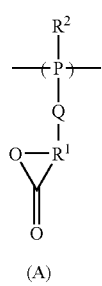

Formula (1)

(A)

wherein Q is a divalent linking group through which P and $R^1$ are linked, $R^1$ is a substituted or unsubstituted propylenyl or butylenyl, P is a linking group constituting the main chain, and $R^2$ is a hydrogen atom, methyl or a halogen atom;

as a fourth aspect, the composition for forming anti-reflective coating as described in the first aspect, wherein the resin is composed of a polymer of formula (2):

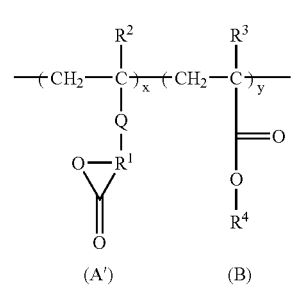

Formula (2)

(A')    (B)

wherein x and y is the number of repeating units, x is 5 to 5,000, y is 2 to 5,000, Q is a divalent linking group through which the carbon atom constituting the main chain and $R^1$ are linked, $R^1$ is a substituted or unsubstituted propylenyl or butylenyl, $R^2$ and $R^3$ are a hydrogen atom, methyl or a halogen atom, $R^4$ is a hydrogen atom, a substituted or unsubstituted alkyl group having 1 to 10 carbon atoms, a substituted or unsubstituted aralkyl group, a substituted or unsubstituted carbocyclic aromatic group, or a substituted or unsubstituted heterocyclic aromatic group, structural unit (A') is in an amount of 1 to 76 mol % and structural unit (B) is in an amount of 99 to 24 mol %;

as a fifth aspect, the composition for forming anti-reflective coating as described in the first aspect, wherein the resin is composed of a polymer of formula (3):

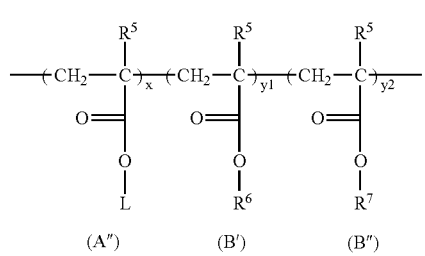

Formula (3)

(A")    (B')    (B")

wherein x, y1 and y2 are the number of repeated units, x is 5 to 5,000, y1 and y2 are 1 or more and the sum of y1 and y2 is 2 to 5,000, $R^5$ is a hydrogen atom or methyl, $R^6$ is hydroxyethyl or hydroxypropyl, $R^7$ is phenyl, benzyl, naphthyl, anthryl or anthrylmethyl, L is (L-1) or (L-2) described below

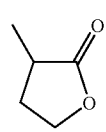

(L-1)

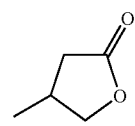

(L-2)

structural unit (A") is in an amount of 1 to 76 mol % and structural units (B') and (B") are in an amount of 1 mol % or more and the sum of (B') and (B") is 99 to 24 mol %;

as a sixth aspect, the composition for forming anti-reflective coating as described in any one of the first to fifth aspects, wherein the resin has a structure with an absorption at 248 nm, 193 nm or 157 nm;

as a seventh aspect, the composition for forming anti-reflective coating as described in the first aspect, wherein the crosslinking agent has at least two crosslink-forming functional groups;

as an eighth aspect, a method of forming an anti-reflective coating for use in a lithographic process in a manufacture of a semiconductor device, comprising the steps of: coating the composition as described in any one of the first to seventh aspects on a substrate, and baking it;

as a ninth aspect, a process for manufacturing a semiconductor device comprising the steps of:

coating the composition according to any one of the first to seventh aspects on a substrate and baking it to form an anti-reflective coating, covering the anti-reflective coating with a photoresist, exposing the substrate covered with the anti-reflective coating and the photoresist to light, developing the exposed substrate, and transferring an image on the substrate by dry etching to form an integrated circuit element; and as a tenth aspect, the process for manufacturing a semiconductor device described in the ninth aspect, wherein the exposure is carried out with light having a wavelength of 193 nm.

BEST MODE FOR CARRYING OUT THE INVENTION

Figure 1:
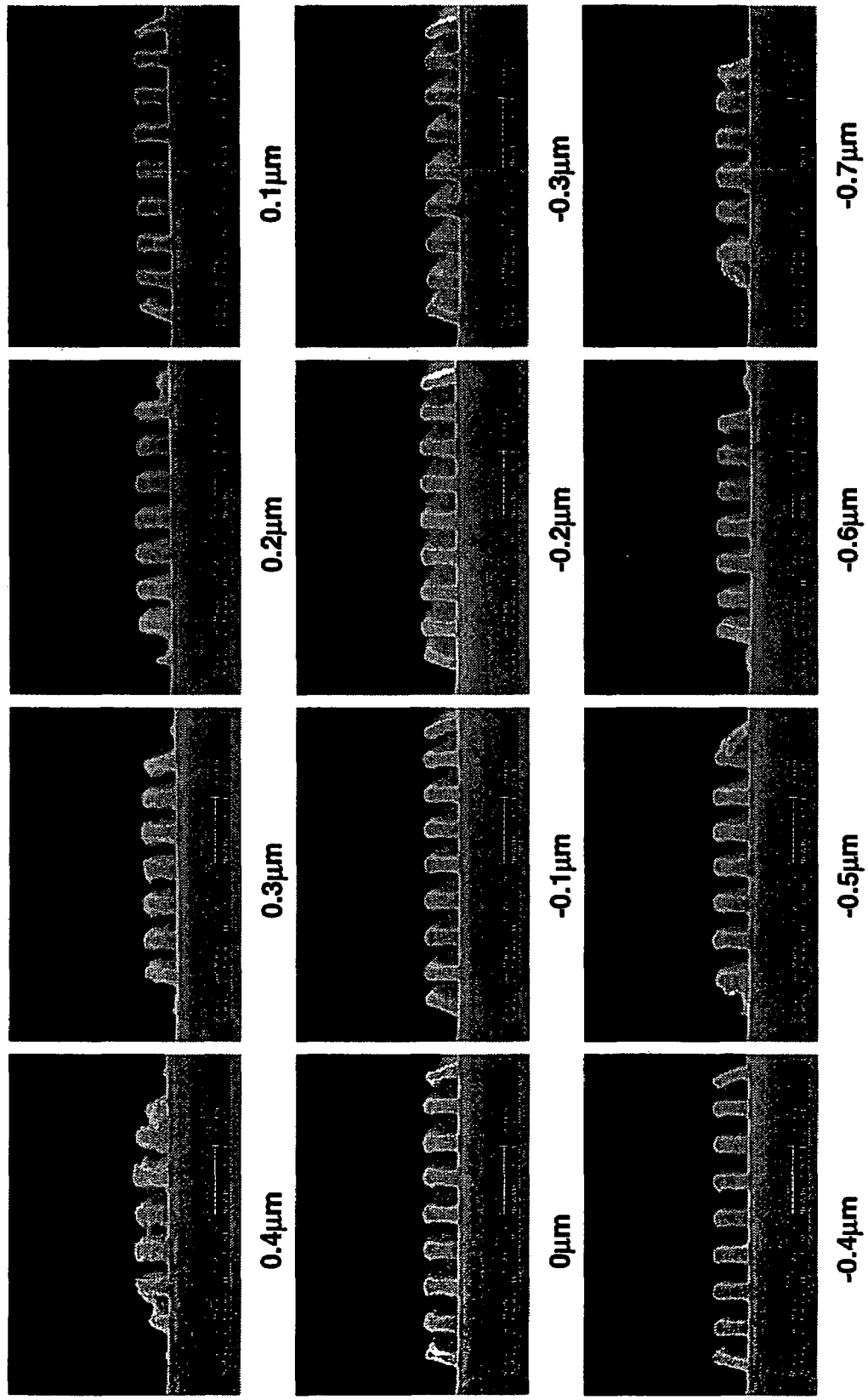
FIG. 1 is scanning electron microscope photographs on margin of depth of focus according to Example 1 of the present invention.

The present invention relates to a composition for forming anti-reflective coating for use in a lithographic process in manufacture of a semiconductor device, comprising a resin having a lactone structure. The composition for forming anti-reflective coating according to the present invention comprises fundamentally a resin having a lactone structure, a crosslinking agent and a solvent, and as arbitrary components a catalyst for crosslinking, a surfactant and the like. The composition for forming anti-reflective coating according to the present invention contains 0.1 to 50% by weight of solids content.

The above-mentioned resin is a resin which a γ (gamma)-lactone structure being a five-membered ring structure or a δ (delta)-lactone structure being a six-membered ring structure is introduced to a main chain thereof or a side chain bonded to the main chain.

The molecular weight of the above-mentioned resin ranges from 1,000 to 1,000,000, preferably from 1,000 to 200,000, and more preferably 1,000 to 100,000 in a weight average molecular weight although it may vary depending on the coating solvents used, the viscosity of the solvent, the shape of the coating, etc.

The γ-lactone used as the above-mentioned resin is a lactone having a five-membered ring structure, and includes, for example substituted or unsubstituted γ-lactone, such as γ-butyrolactone, γ-valerolactone or tetronic acid.

In addition, δ-lactone is a lactone having a six-membered ring structure, and includes, for example substituted or unsubstituted δ-lactone, such as δ-valerolactone or δ-caprolactone.

As the above-mentioned resin, resins which a compound having a lactone structure is bonded at a side chain bonded to the main chain thereof may be used, these resins have at least structural unit (A) of formula (1).

In formula (1), Q is a divalent linking group through which P and $R^1$ are linked, $R^1$ is a substituted or unsubstituted propylenyl or butylenyl, P is a linking group constituting the main chain, and $R^2$ is a hydrogen atom, methyl or a halogen atom. Propylenyl or butylenyl of $R^1$ constitute a lactone ring as a hydrocarbon having 3 or 4 carbon atoms, and are linked to P through Q at a position of the hydrocarbon group. In addition, the propylenyl and butylenyl may be unsubstituted or substituted.

The resins having the structure of formula (1) can be produced, for example by reacting an acrylic resin, such as acrylic acid, an acrylic halide or methacrylic acid with a lactone, such as α-bromo-γ-butyrolactone or α-bromo-δ-valerolactone.

In addition, the resins used in the present invention may have a structure of a copolymer of formula (2) which is a combination of structural unit (A') having an acrylic resin at the main chain and γ-lactone or a derivative thereof, or δ-lactone or a derivative thereof at the side chain with structural unit (B) comprising an acrylic resin.

The above-mentioned copolymer is preferably composed of 1 to 76 mol % of structural unit (A') and 99 to 24 mol % of structural unit (B). In formula (2), x and y are the number of repeating units, x is 5 to 5,000, y is 2 to 5,000, Q is a divalent linking group through which the carbon atom constituting the main chain and $R^1$ are linked, $R^1$ is a substituted or unsubstituted propylenyl or butylenyl $R^2$ and $R^3$ are a hydrogen atom, methyl or a halogen atom, $R^4$ is a hydrogen atom, a substituted or unsubstituted alkyl group having 1 to 10 carbon atoms, a substituted or unsubstituted aralkyl group, a substituted or unsubstituted carbocyclic aromatic group, or a substituted or unsubstituted heterocyclic aromatic group.

Preferable alkyl groups of $R^4$ include linear alkyl groups, such as methyl, ethyl, normal propyl or normal butyl, branched alkyl groups, such as isopropyl, isobutyl or 2-ethylhexyl, alicyclic alkyl groups, such as cyclopentyl or cyclohexyl, alkyl groups substituted with hydroxyl group, such as hydroxyethyl, hydroxypropyl or hydroxybutyl, alkyl groups substituted with halogen atom, such as trichloroethyl or trifluoroethyl. Preferable aralkyl groups include benzyl, 2-phenylethyl, naphthylmethyl or anthrylmethyl, etc. Preferable carbocyclic aromatic groups include phenyl, naphthyl or anthryl, etc., and preferable heterocyclic aromatic groups include pyridyl, quinolinyl or quinoxalinyl, etc. $R^4$ may be used in a single group or in a combination of groups.

Also in formula (2), propylenyl or butylenyl of $R^1$ constitute a lactone ring as a hydrocarbon having 3 or 4 carbon atoms, and are linked to the carbon atom constituting the main chain through Q at a position of the hydrocarbon group. In addition, the propylenyl and butylenyl may be unsubstituted or substituted.

In the resins of formulae (1) and (2), structural units (A) and (A') having a lactone structure are essential structures.

Formula (2) represents a copolymer resin comprising structural unit (A') having a lactone structure at the side chain of an acrylic resin and structural unit (B) composed of an acrylic resin. In the copolymer of formula (2), structural unit (A') is in an amount of 1 to 76 mol % and structural unit (B) is in an amount of 99 to 24 mol %.

In formula (2), $R^1$ is a substituted or unsubstituted propylenyl or butylenyl, $R^2$ and $R^3$ are a hydrogen atom, methyl or a halogen atom, $R^4$ is a hydrogen atom, a substituted or unsubstituted alkyl group having 1 to 10 carbon atoms, a substituted or unsubstituted aralkyl group, a substituted or unsubstituted carbocyclic aromatic group, or a substituted or unsubstituted heterocyclic aromatic group.

Herein, preferable alkyl groups of $R^4$ include linear alkyl groups, such as methyl, ethyl, normal propyl or normal butyl, branched alkyl groups, such as isopropyl, isobutyl or 2-ethylhexyl, alicyclic alkyl groups, such as cyclopentyl or cyclohexyl, alkyl groups substituted with hydroxyl group, such as hydroxyethyl, hydroxypropyl or hydroxybutyl, alkyl groups substituted with halogen atom, such as trichloroethyl or trifluoroethyl. Preferable aralkyl groups include benzyl, 2-phenylethyl, naphthylmethyl or anthrylmethyl. Preferable carbocyclic aromatic groups include phenyl, naphthyl or anthryl, and preferable heterocyclic aromatic groups include pyridyl, quinolinyl or quinoxalinyl. $R^4$ may be used in a single group or in a combination of groups.

When the resins of formula (2) is applied as a anti-reflective coating, dry etching rate is increased with an increase in an introduction amount of structural unit (A') composed of a γ-lactone structure, δ-lactone structure or a combination thereof. Preferable proportion is 1 to 76 mol % of structural unit (A') and 99 to 24 mol % of acrylic monomer structural unit (B) in copolymer (2).

The methods for producing the resins of formula (2) include a method comprising copolymerizing a monomer of structural unit (A') with a monomer of structural unit (B) or a combination thereof, or a method comprising polymerizing a monomer of structural unit (B) or a combination thereof and reacting the resulting resin with a compound having a lactone structure.

In the method comprising copolymerizing a monomer of structural unit (A') with a monomer of structural unit (B) or a combination thereof, for example, an acrylic compound such as acrylic acid, an acrylic halide or methacrylic acid is at first reacted with a lactone compound such as α-bromo-γ-butyrolactone or α-bromo-δ-valerolactone to produce a monomer of structural unit (A'), and then the monomer is copolymerized with a monomer of structural unit (B) composed of acrylic acid, an acrylic halide, methacrylic acid or an ester thereof, or a combination of structural units (B) to produce a resin of formula (2).

In addition, the resin of formula (2) can be produced by polymerizing a monomer of structural unit (B) or a combination thereof and reacting the resulting polymer with a lactone compound such as α-bromo-γ-butyrolactone or α-bromo-δ-valerolactone.

The resins in the present invention may be polymers having the structure of formula (3).

Herein, $R^5$ is a hydrogen atom or methyl, $R^6$ is hydroxyethyl or hydroxypropyl, $R^7$ is phenyl, benzyl, naphthyl, anthryl or anthrylmethyl, L is (L-1) or (L-2) described below

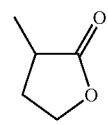

(L-1)

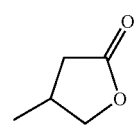

(L-2)

The resins of formula (3) are copolymer resins consisting of structural unit (A") having a lactone structure at the side chain of an acrylic resin and structural units (B') and (B") composed of an acrylic resin. Structural unit (A") is in an amount of 1 to 76 mol % and structural units (B') and (B") are in an amount of 1 mol % or more and the sum of (B') and (B") is 99 to 24 mol % in the copolymer (3).

Also in the resins of formula (3), when it is applied as a anti-reflective coating, dry etching rate is increased with an increase in an introduction amount of structural unit (A") having a lactone structure.

Although the contents of the above-mentioned structural units (A'), (B), (A"), (B') and (B") are indicated in the unit of mol %, they have equivalent values even when they would be indicated in the unit of % by weight.

The content of the resins of formulae (1) to (3) in the composition for forming anti-reflective coating according to the present invention is 0.1 to 50 parts by weight, preferably 1 to 30 parts by weight based on 100 parts by weight of the total composition.

The resins of formulae (1), (2) and (3) may be any of random copolymers, block copolymers and graft copolymers. The resin for forming the anti-reflective coating of the present invention can be synthesized by various methods such as radical polymerization, anionic polymerization or cationic polymerization. As the type of polymerization, various methods such as solution polymerization, suspension polymerization, emulsion polymerization or bulk polymerization are possible.

The anti-reflective coating forming composition of the present invention further contains a crosslinking agent. The crosslinking agent includes, for example, melamines, substituted ureas, polymers having epoxy groups and the like. The agent is preferably a crosslinking agent having at least two crosslink-forming functional groups, methoxymethylated glycoluril, methoxymethylated melamine or the like, more preferably tetramethoxymethyl glycoluril or hexamethoxymethyl melamine. The addition amount of the crosslinking agent may vary depending on the coating solvents used, the underlying substrate used, the viscosity of the solvent required, the shape of the coating required, etc., and usually 0.001 to 20 parts by weight, preferably 0.01 to 10 parts by weight, more preferably 0.1 to 5.0 parts by weight based on 100 parts by weight of the total composition. These crosslinking agents may cause a crosslinking reaction due to autocondensation. If any crosslinkable functional group is present on the polymer of formula (1) or (2), the crosslinking agent can cause a crosslinking reaction with the crosslinkable functional group. In addition, the crosslinking agent may cause a crosslinking reaction with a hydroxyl group on the polymer of formula (3).

It is preferable that the crosslinking agent causes a crosslinking reaction with the polymer of formula (1) or (2).

Therefore, it is preferable that a functional group that can cause a crosslinking reaction is present on any of structural unit (A), (A') or (B), or both thereof.

In the resins used in the composition for forming anti-reflective coating according to the present invention, it is possible to copolymerize further non-crosslinking monomers into a monomer for forming structural unit (A) in the preparation of the polymer of formula (1), into a monomer for forming structural units (A') and (B) in the preparation of the polymer of formula (2), or into a monomer for forming structural units (A"), (B') and (B") in the preparation of the polymer of formula (3). This allows minute adjustment of dry etching rate, reflectivity, etc. Such a copolymerizable monomer includes, for example, compounds having at least one addition polymerizable unsaturated bond selected from acrylic acid esters, acrylamides, methacrylic acid esters, methacrylamides, allyl compounds, vinyl ethers, vinyl esters, styrenes, crotonic acid esters, etc.

The acrylic acid esters include, for example, alkyl acrylates having 1 to 10 carbon atoms in the alkyl group.

The methacrylic acid esters include, for example, alkyl methacrylates having 1 to 10 carbon atoms in the alkyl group.

The acrylamides include, for example, acrylamide, N-alkylacrylamides, N-arylacrylamides, N,N-dialkylacrylamides, N,N-diarylacrylamides, N-methyl-N-phenylacrylamide, N-2-acetamide ethyl-N-acetylacrylamide, etc.

The methacrylamides include, for example, methacrylamide, N-alkylmethacrylamides, N-arylmethacrylamides, N,N-dialkylmethacrylamides, N,N-diarylmethacrylamides, N-methyl-N-phenylmethacrylamide, N-ethyl-N-phenylmethacrylamide, etc.

The vinyl ethers include, for example, alkyl vinyl ethers, vinyl aryl ethers, etc.

The vinyl esters include, for example, vinyl butyrate, vinyl isobutyrate, vinyl trimethylacetate, etc.

The styrenes include, for example, styrene, alkylstyrenes, alkoxystyrenes, halogenostyrenes, carboxystyrene, etc.

The crotonic acid esters include, for example, alkyl crotonates such as butyl crotonate, hexyl crotonate, glycerine monocrotonate, etc.

Also, mention may be made of dialkyl itaconates, monoalkyl esters or dialkyl esters of maleic acid or fumaric acid, crotonic acid, itaconic acid, maleic anhydride, acrylonitrile, methacrylonitrile, maleylonitrile, etc. In addition, generally, addition polymerizable unsaturated compounds which can copolymerize with the monomer of structural unit (A), the monomer of structural units (A') and (B) or the monomer of structural units (A"), (B') and (B") may be used.

The anti-reflective coating forming composition of the present invention may contain further light absorbing agents, rheology controlling agents, adhesion auxiliaries, surfactants, etc. in addition to the above described ones, if necessary.

The rheology controlling agents are added mainly aiming at increasing the flowability of the anti-reflective coating forming composition and in particular in the baking step, increasing filling property of the anti-reflective coating forming composition into the inside of holes. Specific examples thereof include phthalic acid derivatives such as dimethyl phthalate, diethyl phthalate, diisobutyl phthalate, dihexyl phthalate or butyl isodecyl phthalate; adipic acid derivatives such as di-n-butyl adipate, diisobutyl adipate, diisooctyl adipate or octyldecyl adipate; maleic acid derivatives such as di-n-butyl maleate, diethyl maleate or dinonyl maleate; oleic acid derivatives such as methyl oleate, butyl oleate or tetrahydrofurfuryl oleate; or stearic acid derivatives such as n-butyl stearate or glyceryl stearate. The rheology controlling agents are blended in proportions of usually less than 30 parts by weight based on 100 parts by weight of the total composition.

The adhesion auxiliaries are added mainly for the purpose of increasing the adhesion between the substrate or resist and the anti-reflective coating forming composition, in particular preventing the detachment of the resist in development. Specific examples thereof include chlorosilanes such as trimethylchlorosilane, dimethylvinylchlorosilane, methyldiphenylchlorosilane or chloromethyldimethylchlorosilane; alkoxysilanes such as trimethylmethoxysilane, dimethyldiethoxysilane, methyidimethoxysilane, dimethylvinylethoxysilane, diphenyidimethoxysilane or phenyltriethoxysilane; silazanes such as hexamethyldisilazane, N,N'-bis(trimethylsilyl)urea, dimethyltrimethylsilylamine or trimethylsilylimidazole; silanes such as vinyltrichlorosilane, γ-chloropropyltrimethoxysilane, γ-aminopropyltriethoxysilane or γ-glycidoxypropyltrimethoxysilane; heterocyclic compounds such as benzotriazole, benzimidazole, indazole, imidazole, 2-mercaptobenzimidazole, 2-mercaptobenzothiazole, 2-mercaptobenzoxazole, urazole, thiouracyl, mercaptoimidazole or mercaptopyrimidine; ureas such as 1,1-dimethylurea or 1,3-dimethylurea, or thiourea compounds. The adhesion auxiliaries are added in proportions of usually less than 5 parts by weight, preferably less than 2 parts by weight, based on 100 parts by weight of the total composition.

The anti-reflective coating forming composition of the present invention may contain surfactants with view to preventing the occurrence of pinholes or striations and further increasing coatability not to cause surface unevenness. As the surfactants, mention may be made of, for example, nonionic surfactants such as polyoxyethylene alkyl ethers, e.g., polyoxyethylene lauryl ether, polyoxyethylene stearyl ether, polyoxyethylene cetyl ether, polyoxyethylene oleyl ether, etc., polyoxyethylene alkyl allyl ethers, e.g., polyoxyethylene octyl phenol ether, polyoxyethylene nonyl phenol ether; polyoxyethylene/polyoxypropylene block copolymers, etc., sorbitan fatty acid esters, e.g., sorbitan monolaurate, sorbitan monopalmitate, sorbitan monostearate, sorbitan monooleate, sorbitan trioleate, sorbitan tristearate, etc., polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, etc.; fluorine based surfactants, e.g., EFTOP EF301, EF303, EF352 (Tochem Products Co., Ltd.), MEGAFAC F171, F173 (Dainippon Ink and Chemicals, Inc.), FLUORAD FC430, FC431 (Sumitomo 3M Limited), ASAHI GUARD AG710, SURFLON S-382, SC101, SC102, SC103, SC104, SC105, SC106 (Asahi Glass Co., Ltd.), organosiloxane polymer KP341 (Shinetsu Chemical Co., Ltd.), etc. The blending amount of the surfactants is usually 0.2 parts by weight or less, preferably 0.1 part by weight or less, based on 100 parts by weight of the total composition of the present invention. The surfactants may be added singly or two or more of them may be added in combination.

As catalyst for promoting the above-mentioned crosslinking reaction in the present invention, organic acids, such as p-toluenesulfonic acid, trifluoromethanesulfonic acid or pyridinium p-toluenesulfonate, hydroquinone and the like may be added. The blending amount thereof is 0.2 to 3 parts by weight, preferably 0.4 to 2 part by weight based on 100 parts by weight of the total solid content.

In the present invention, as the solvents for dissolving the above-described resin, use may be made of ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3ethoxypropionate, methyl pyruvate, ethyl pyruvate, ethyl acetate, butyl acetate, ethyl lactate, butyl lactate, etc. The organic solvents may be used singly or in combination of two or more of them.

Further, high boiling solvents such as propylene glycol monobutyl ether or propylene glycol monobutyl ether acetate may be mixed.

Among the solvents, propylene glycol monomethyl ether, propylene glycol monomethyl ether acetate, ethyl lactate, butyl lactate, and cyclohexanone are preferred for increasing the leveling property.

As resists to be coated as an upper layer of the anti-reflective coating formed by using the composition of the present invention, any of negative type and positive type resists may be used and such a resist includes a positive type resist consisting of a novolak resin and 1,2-naphthoquinone diazide sulfonic acid ester, a chemically-amplified type resist which consists of a photoacid generator and a binder having a group which is decomposed with an acid and increases alkali dissolution speed, a chemically-amplified type resist consisting of an alkali-soluble binder, a photoacid generator, and a low molecular compound which is decomposed with an acid and increases the alkali dissolution speed of the resist, a chemically-amplified resist consisting of a photoacid generator, a binder having a group which is decomposed with an acid and increases the alkali dissolution speed, and a low molecular compound which is decomposed with an acid and increases the alkali dissolution speed of the resist, for example a resist of trade name PAR710 manufactured by Sumitomo Chemical Co., Ltd.

The anti-reflective coating composition of the present invention may contain photoacid generators in order to adjust the acidity to that of a resist applied thereon. Preferable photoacid generators include for example onium salt photoacid generators, such as bis(4-t-butylpheny)iodonium trifluoromethanesulfonate or triphenylsulfonium trifluoromethanesulfonate, halogen-containing photoacid generators, such as phenyl-bis(trichloromethyl)-s-triazine, sulfonate photoacid generators, such as benzoin tosylate or N-hydroxysuccinimide trifluoromethanesulfonate. The photoacid generators are added in an amount of 0.2 to 3 parts by weight, preferably 0.4 to 2 parts by weight based on 100 parts by weight of the total solid content.

As the developer for the above-mentioned positive type photoresist, use may be made of aqueous solutions of alkalis, e.g., inorganic alkalis such as sodium hydroxide, potassium hydroxide, sodium carbonate, sodium silicate, sodium metasilicate or aqueous ammonia, primary amines such as ethylamine or n-propylamine, secondary amines such as diethylamine or di-n-butylamine, tertiary amines such as triethylamine or methyldiethylamine, alcohol amines such as dimethylethanolamine or triethanolamine, quaternary ammonium salts such as tetramethylammonium hydroxide, tetraethylammonium hydroxide or choline, cyclic amines such as pyrrole or piperidine, etc. Furthermore, a suitable amount of an alcohol such as isopropyl alcohol or nonionic surfactant can be added to the aqueous solution of above-described alkalis. Among these, a preferred developer includes quaternary ammonium salts, more preferably tetramethylammonium hydroxide and choline.

Now, the method for forming resist patterns by using the composition for forming anti-reflective coating of the present invention will be described. On a substrate for use in the production of precision integrated circuit element (for example, transparent substrates such as silicon/silicon dioxide coat, glass substrate or ITO substrate), an anti-reflective coating forming composition is coated by a suitable coating method, for example, with a spinner, a coater or the like, and thereafter the substrate is baked to cure the composition to fabricate an anti-reflective coating. The film thickness of the anti-reflective coating is preferably 0.01 to 3.0 µm. The conditions of baking after the coating are 80 to 250° C. for 1 to 120 minutes. Then, a photoresist is coated, it is exposed to light through a predetermined mask, developed, rinsed and dried to obtain a good resist pattern. If necessary, post exposure bake (PEB) may be performed. In addition, it is able to form a desired pattern on the substrate by removing by dry etching a part of the anti-reflective coating which a photoresist was removed by development in the previous step.

EXAMPLES

Hereinafter, the present invention will be described based on examples but the present invention is not limited thereto.

Synthesis Example 1

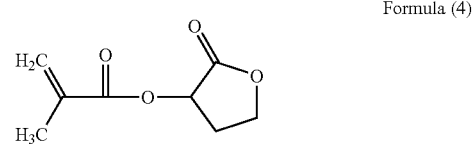

Formula (4)

After 6.6 g (0.039 mol) of butyrolactone methacrylate of formula (4) described above, 6.6 g (0.046 mol) of hydroxypropylmethacrylate and 6.8 g (0.039 mol) of benzylmethacrylate were dissolved in 64.4 g of tetrahydrofuran in a flask, the atmosphere in the flask was replaced with nitrogen and the flask was warmed to a reflux temperature. After the reflux was started, 0.2 g of azobisisobutyronitrile (AIBN) dissolved in 10 g of tetrahydrofuran was added under pressure by nitrogen and reacted for 24 hours. The reaction solution was cooled, and then introduced

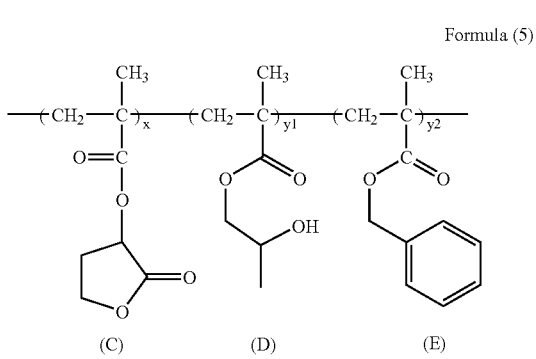

Formula (5)

(C) (D) (E)

into diethyl ether to re-precipitate polymers. The resulting polymers were dried under heating to produce a resin of formula (5). The resulting resin had a polymerization degree of 490, a weight average molecular weight Mw of 80,000 (calculated as polystyrene), 31 mol % of structural unit (C), 38 mol % of structural unit (D) and 31 mol % of structural unit (E), and a yield of 90%.

Synthesis Example 2

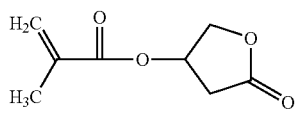

Formula (6)

After 6.6 g (0.039 mol) of butyrolactone methacrylate of formula (6) described above, 6.6 g (0.046 mol) of hydroxypropylmethacrylate and 6.8 g (0.039 mol) of benzylmethacrylate were dissolved in 64.4 g of tetrahydrofuran in a flask, the atmosphere in the flask was replaced with nitrogen and the flask was warmed to a reflux temperature. After the reflux was started, 0.2 g of azobisisobutyronitrile (AIBN) dissolved in 10 g of tetrahydrofuran was added under pressure by nitrogen and reacted for 24 hours. The reaction solution was cooled, and then introduced into diethyl ether to re-precipitate polymers. The resulting polymers were dried under heating to produce a resin of formula (7). The resulting resin had a polymerization degree of 490, a weight average molecular weight Mw of 80,000 (calculated as polystyrene), 31 mol % of structural unit (C'), 38 mol % of structural unit (D) and 31 mol % of structural unit (E), and a yield of 90%.

Formula (7)

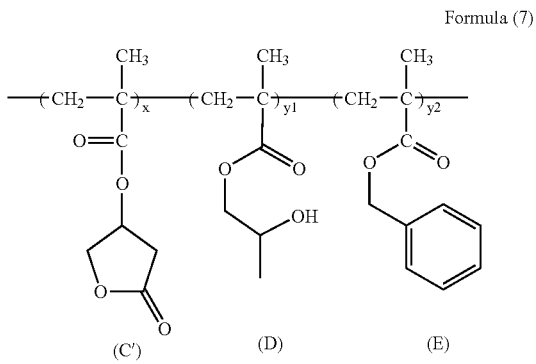

(C') (D) (E)

Synthesis Example 3

After 6.6 g (0.039 mol) of mevalonic lactone methacrylate, 6.6 g (0.046 mol) of hydroxypropylmethacrylate and 6.8 g (0.039 mol) of benzylmethacrylate were dissolved in 64.4 g of tetrahydrofuran in a flask, the atmosphere in the flask was replaced with nitrogen and the flask was warmed to a reflux temperature. After the reflux was started, 0.2 g of azobisisobutyronitrile (AIBN) dissolved in 10 g of tetrahydrofuran was added under pressure by nitrogen and reacted for 24 hours. The reaction solution was cooled, and then introduced into diethyl ether to re-precipitate polymers. The resulting polymers were dried under heating to produce a resin of formula (8). The resulting resin had a polymerization degree of 470, a weight average molecular weight Mw of 80,000 (calculated as polystyrene), 28 mol % of structural unit (C''), 39 mol % of structural unit (D) and 33 mol % of structural unit (E), and a yield of 90%.

Formula (8)

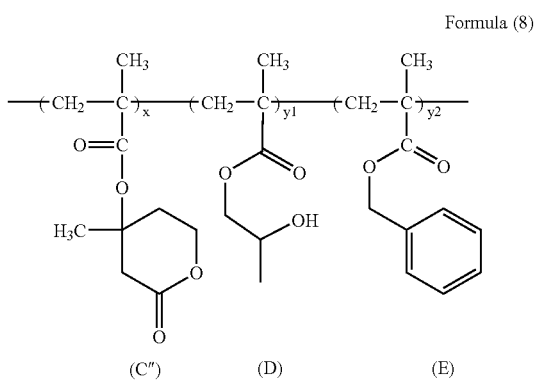

(C'') (D) (E)

Synthesis Example 4

After 75.0 g (0.58 mol) of hydroxyethylmethacrylate, 45.0 g (0.43 mol) of styrene and 30.0 g (0.18 mol) of butyrolactone methacrylate of formula (4) described above were dissolved in 550 g of tetrahydrofuran in a flask, the atmosphere in the flask was replaced with nitrogen and the flask was warmed to a reflux temperature. After the reflux was started, 1.5 g of azobisisobutyronitrile (AIBN) dissolved in 50 g of tetrahydrofuran was added under pressure by nitrogen and reacted for 24 hours. The reaction solution was cooled, and then introduced into diethyl ether to re-precipitate polymers. The resulting polymers were dried under heating to produce a resin of formula (9). The resulting resin had a weight average molecular weight Mw of 31,000 (calculated as polystyrene), 15 mol % of structural unit (C), 49 mol % of structural unit (D') and 36 mol % of structural unit (E'), and a yield of 90%.

Formula (9)

Synthesis Example 5

After 7.5 g (0.044 mol) of butyrolactone methacrylate of formula (4) described above, 25.1 g (0.174 mol) of hydroxypropylmethacrylate and 17.3 g (0.122 mol) of glycidylmethacrylate were dissolved in 190 g of propylene glycolmonomethyl ether in a flask, the atmosphere in the flask was replaced with nitrogen and the flask was warmed to 80° C. Thereafter, 0.5 g of azobisisobutyronitrile (AIBN) dissolved in 10 g of propylene glycolmonomethyl ether was added under pressure by nitrogen and reacted at 80° C. for 24 hours to produce a terpolymer resin (a weight average molecular weight Mw of 88,000 (calculated as polystyrene)) consisting of butyrolactone methacrylate, hydroxypropylmethacrylate and glycidylmethacrylate. Then, 14.6 g of 9-anthracene carboxylic acid, 0.4 g of benzyl triethyl ammonium chloride and 58.4 g of propylene glycolmonomethyl ether were added to 150 g of a propylene glycolmonomethyl ether solution comprising 30 g of the resin, and reacted at 130° C. for 24 hours to obtain a solution containing a resin of formula (10). The resulting resin was composed of 13 mol % of structural unit (C), 51 mol % of structural unit (D) and 36 mol % of structural unit (E").

Formula (10)

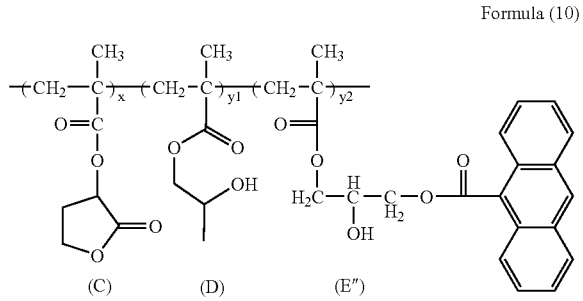

Synthesis Example 6

After 13.2 g (0.092 mol) of hydroxypropylmethacrylate and 6.8 g (0.039 mol) of benzylmethacrylate were dissolved in 64.4 g of tetrahydrofuran in a flask, the atmosphere in the flask was replaced with nitrogen and the flask was warmed to a reflux temperature. After the reflux was started, 0.2 g of azobisisobutyronitrile (AIBN) dissolved in 10 g of tetrahydrofuran was added under pressure by nitrogen and reacted for 24 hours. The reaction solution was cooled, and then introduced into diethyl ether to re-precipitate polymers. The resulting polymers were dried under heating to produce a resin of formula (11). The resulting resin had a polymerization degree of 455, a weight average molecular weight Mw of 70,000 (calculated as polystyrene), 70 mol % of structural unit (D) and 30 mol % of structural unit (E), and a yield of 90%.

Formula (11)

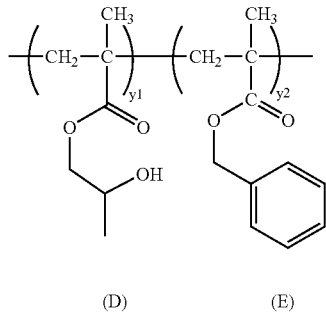

Example 1

80 g of a solution of propylene glycol monomethyl ether containing 16 g of the resin obtained in Synthesis Example 1 was mixed with 4 g of hexamethoxymethylmelamine as a crosslinking agent and 0.4 g of p-toluenesulfonic acid as a catalyst for crosslinking, and dissolved in 565 g of propylene glycol monomethyl ether as a solvent to obtain a 3.1% solution. Then, the solution was filtered through a micro filter made of polyethylene having a pore diameter of 0.10 μm, and then, the solution was filtered through a micro filter made of polyethylene having a pore diameter of 0.05 μm, to prepare an anti-reflective coating composition. The solution was coated on a silicon wafer using a spinner and the wafer was heated at 205° C. for 1 minute on a hot plate to form an anti-reflective coating (film thickness: 0.11 μm). Measurement of the anti-reflective coating by a spectral ellipsometer indicated a refractive index n of 1.82 and an attenuation coefficient k of 0.34 at 193 nm.

Example 2

80 g of a solution of propylene glycol monomethyl ether containing 16 g of the resin obtained in Synthesis Example 2 was mixed with 4 g of tetramethoxymethyl glycoluril as a crosslinking agent and 0.4 g of pyridinium p-toluenesulfonic acid as a catalyst for crosslinking, and dissolved in 565 g of propylene glycol monomethyl ether as a solvent to obtain a 3.1% solution. Then, the solution was filtered through a micro filter made of polyethylene having a pore diameter of 0.10 μm, and then, the solution was filtered through a micro filter made of polyethylene having a pore diameter of 0.05 μm, to prepare an anti-reflective coating composition. The solution was coated on a silicon wafer using a spinner and the wafer was heated at 205° C. for 1 minute on a hot plate to form an anti-reflective coating (film thickness: 0.11 μm). Measurement of the anti-reflective coating by a spectral ellipsometer indicated a refractive index n of 1.82 and an attenuation coefficient k of 0.34 at 193 nm.

Example 3

80 g of a solution of propylene glycol monomethyl ether containing 16 g of the resin obtained in Synthesis Example 3 was mixed with 4 g of hexamethoxymethylmelamine as a crosslinking agent and 0.4 g of p-toluenesulfonic acid as a catalyst for crosslinking, and dissolved in 565 g of propylene glycol monomethyl ether as a solvent to obtain a 3.1% solution. Then, the solution was filtered through a micro filter made of polyethylene having a pore diameter of 0.10 μm, and then, the solution was filtered through a micro filter made of polyethylene having a pore diameter of 0.05 μm, to prepare an anti-reflective coating composition. The solution was coated on a silicon wafer using a spinner and the wafer was heated at 205° C. for 1 minute on a hot plate to form an anti-reflective coating (film thickness: 0.11 μm). Measurement of the anti-reflective coating by a spectral ellipsometer indicated a refractive index n of 1.82 and an attenuation coefficient k of 0.34 at 193 nm.

Example 4

16 g of the resin obtained in Synthesis Example 4, 4 g of hexamethoxymethylmelamine as a crosslinking agent and 0.25 g of pyridinium p-toluenesulfonic acid as a catalyst for crosslinking were mixed, and dissolved in 284.4 g of propylene glycol monomethyl ether and 31.6 g of propylene glycol monomethyl ether acetate as solvent to obtain a 5.1% solution. Then, the solution was filtered through a micro filter made of polyethylene having a pore diameter of 0.10 μm, and then, the solution was filtered through a micro filter made of polyethylene having a pore diameter of 0.05 μm, to prepare an anti-reflective coating composition. The solution was coated on a silicon wafer using a spinner and the wafer was heated at 205° C. for 1 minute on a hot plate to form an anti-reflective coating (film thickness: 0.11 μm). Measurement of the anti-reflective coating by a spectral ellipsometer indicated a refractive index n of 1.74 and an attenuation coefficient k of 0.59 at 193 nm.

Example 5

2 g of the resin obtained in Synthesis Example 5, 0.3 g of hexamethoxymethylmelamine as a crosslinking agent and 0.01 g of p-toluenesulfonic acid as a catalyst for crosslinking were mixed, and dissolved in 37.3 g of propylene glycol monomethyl ether and 19.4 g of propylene glycol monomethyl ether acetate as solvent to obtain a solution. Then, the solution was filtered through a micro filter made of polyethylene having a pore diameter of 0.10 μm, and then, the solution was filtered through a micro filter made of polyethylene having a pore diameter of 0.05 μm, to prepare an anti-reflective coating composition. The solution was coated on a silicon wafer using a spinner and the wafer was heated at 205° C. for 1 minute on a hot plate to form an anti-reflective coating (film thickness: 0.06 μm). Measurement of the anti-reflective coating by a spectral ellipsometer indicated a refractive index n of 1.53 and an attenuation coefficient k of 0.49 at 248 nm.

Comparative Example 1

80 g of a solution of propylene glycol monomethyl ether containing 16 g of the resin obtained in Synthesis Example 6 above was mixed with 4 g of hexamethoxymethylmelamine as a crosslinking agent and 0.4 g of p-toluenesulfonic acid monohydrate as a catalyst for crosslinking and the mixture was dissolved in 565 g of propylene glycol monomethyl ether as a solvent to obtain a 3.1% solution. Then, the solution was filtered through a micro filter made of polyethylene having a pore diameter of 0.10 μm, and then, the solution was filtered through a micro filter made of polyethylene having a pore diameter of 0.05 μm, to prepare an anti-reflective coating forming composition. The solution was coated on a silicon wafer using a spinner and the wafer was heated at 205° C. for 1 minute on a hot plate to form an anti-reflective coating (film thickness: 0.11 μm). Measurement of the anti-reflective coating by a spectral ellipsometer indicated a refractive index n of 1.82 and an attenuation coefficient k of 0.34 at 193 nm.

Comparative Example 2

80 g of a solution of propylene glycol monomethyl ether containing 20 g of the resin obtained in Synthesis Example 1 above was dissolved in 565 g of propylene glycol monomethyl ether as a solvent to obtain a 3.1% solution. Then, the solution was filtered through a micro filter made of polyethylene having a pore diameter of 0.10 μm, and then, the solution was filtered through a micro filter made of polyethylene having a pore diameter of 0.05 μm, to prepare an anti-reflective coating forming composition. The solution was coated on a silicon wafer using a spinner and the wafer was heated at 205° C. for 1 minute on a hot plate to form an anti-reflective coating (film thickness: 0.11 μm). Measurement of the anti-reflective coating by a spectral ellipsometer indicated a refractive index n of 1.80 at 193 nm.

The solutions obtained in Examples 1 to 5 and Comparative Examples 1 and 2 were coated on silicon wafers by means of a spinner. The coated silicon wafers were heated at 205° C. for 1 minute on a hot plate to form anti-reflective coatings (film thickness 0.23 μm as to Examples 1 to 4 and Comparative Examples 1 and 2, and film thickness 0.10 μm as to Example 5). The anti-reflective coatings were dipped in a solvent used for resists, for example, ethyl lactate and propylene glycol monomethyl ether and as a result it was confirmed that coatings from Examples 1 to 5 and Comparative Example 1 were insoluble in these solvents. However, in a case of Comparative Example 2 in which no crosslinking agent is contained, curing did not fully occur and a film loss was confirmed by the dipping in the solvent.

The solutions obtained in Examples 1 to 5 and Comparative Examples 1 and 2 were coated on silicon wafers by means of a spinner. The coated silicon wafers were heated at 205° C. for 1 minute on a hot plate to form anti-reflective coatings (film thickness 0.078 μm as to Examples 1 to 4 and Comparative Examples 1 and 2, and film thickness 0.10 μm as to Example 5) and film thickness was measured. On each anti-reflective coating for lithography was coated a commercially available resist solution (trade name: PAR710 manufactured by Sumitomo Chemical Co., Ltd. as to Examples 1 to 4 and Comparative Examples 1 and 2, and trade name: SEPR-430 manufactured by Shinetsu Chemical Co., Ltd. as to Example 5) by means of a spinner. The coated wafers were heated at 90° C. for 1 minute on a hot plate. After exposure of the resists to light, post exposure bake (PEB) was performed at 90° C. for 1.5 minutes. After developing the resists, the film thickness of the anti-reflective coatings was measured and as a result it was confirmed that no intermixing occurred between the anti-reflective coatings for lithography obtained in Examples 1 to 5 and Comparative Example 1 and the resist layers. However, in a case of Comparative Example 2 in which no crosslinking agent is contained, intermixing occurred with dissolution of resin into the solvent for photoresist and it was impossible to resolve a photoresist.

Figure 2:
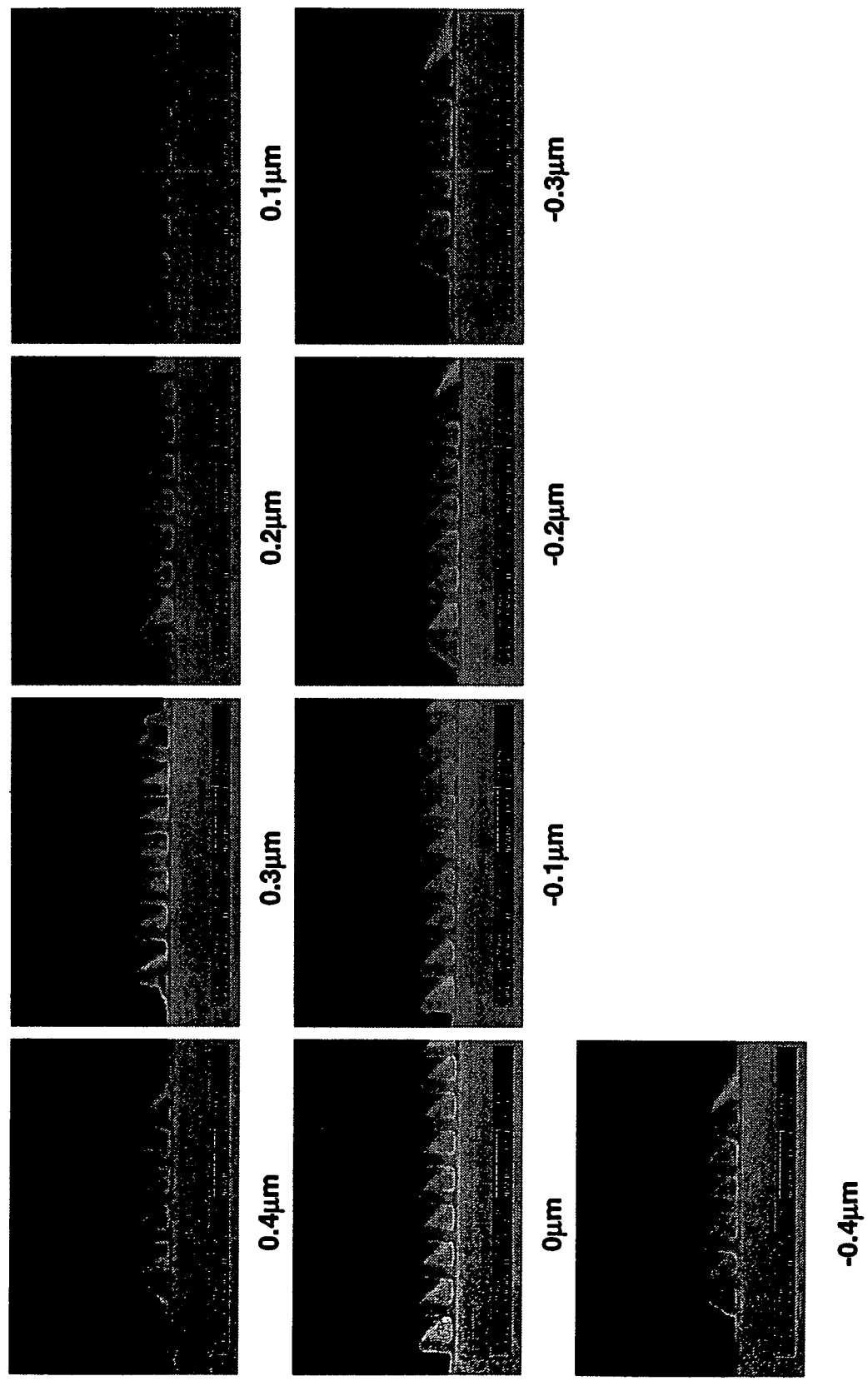
FIG. 2 is scanning electron microscope photographs on margin of depth of focus according to Comparative Example 1.

The margin of depth of focus was evaluated according to the method described below. The solutions obtained in Examples 1 to 5 and Comparative Example 1 were coated on silicon wafers by means of a spinner. The coated silicon wafers were heated at 205° C. for 1 minute on a hot plate to form anti-reflective coatings (film thickness 0.078 μm as to Examples 1 to 4 and Comparative Example 1, and film thickness 0.06 μm as to Example 5). On each anti-reflective coating for lithography was coated a commercially available resist solution (trade name: PAR710 manufactured by Sumitomo Chemical Co., Ltd. as to Examples 1 to 3 and Comparative Example 1, trade name: GAR8105G1 manufactured by Fuji Photo Film Co., Ltd. as to Example 4 and trade name: SEPR-430 manufactured by Shinetsu Chemical Co., Ltd. as to Example 5) by means of a spinner. The coated wafers were heated at 90° C. for 1 minute on a hot plate to form photoresist coatings (film thickness 0.33 μm as to Examples 1 to 4 and Comparative Example 1, and film thickness 0.55 μm as to Example 5). These coatings were exposed to light by using PAS 5500/990 Scanner manufactured by ASML Inc., (a wavelength of 193 nm as to Examples 1 to 4 and Comparative Example 1, a wavelength of 248 nm as to Example 5, NA, σ: 0.63, 0.87/0.57 (Annular) through a mask by which 9 lines with a line-width and a line-space of 0.13 μm (that is, 0.13 μm L/S (dense line)) would be formed on a photoresist after development as to Examples 1 to 4 and Comparative Example 1, or through a mask by which lines with a line-width of 0.175 μm would be similarly formed as to Example 5. Thereafter, the coatings were baked on a hot plate at 130° C. for 60 seconds, cooled and then developed in 0.26 N tetramethyl ammonium hydroxide developer according to 60-second single paddle process being an industrial standard. The margin of depth of focus was determined as follows. That is, the above-mentioned exposure to light was carried out while focus positions were displaced by 0.1 μm up or down from the optimum focus position as base, and thereafter resist patterns were formed by developing process. When 7 lines or more of 9 lines to be formed on the photoresist were formed in a specimen, the specimen was judged to be passed, on the other hand when 6 lines or less were formed, the specimen was judged to be failed. Then, a top-to-bottom width of displacement in focus positions which a specimen was passed in the test was regarded as margin of depth of focus in the specimen. The results in each specimen are shown in Table 1. In addition, FIGS. 1 and 2 show scanning electron microscope photographs of Example 1 and Comparative Example 1, respectively. From FIG. 1, it is clear that 7 lines or more were observed in focus positions ranging from 0.3 μm to –0.6 μm, that is, in a region of 0.9 μm width in Example 1 according to the present invention. On the contrary, it is clear that 7 lines or more were observed in focus positions ranging from 0.3 μm to –0.2 μm, that is, in a region of only 0.5 μm width in Comparative Example 1 shown in FIG. 2.

Figure 3:
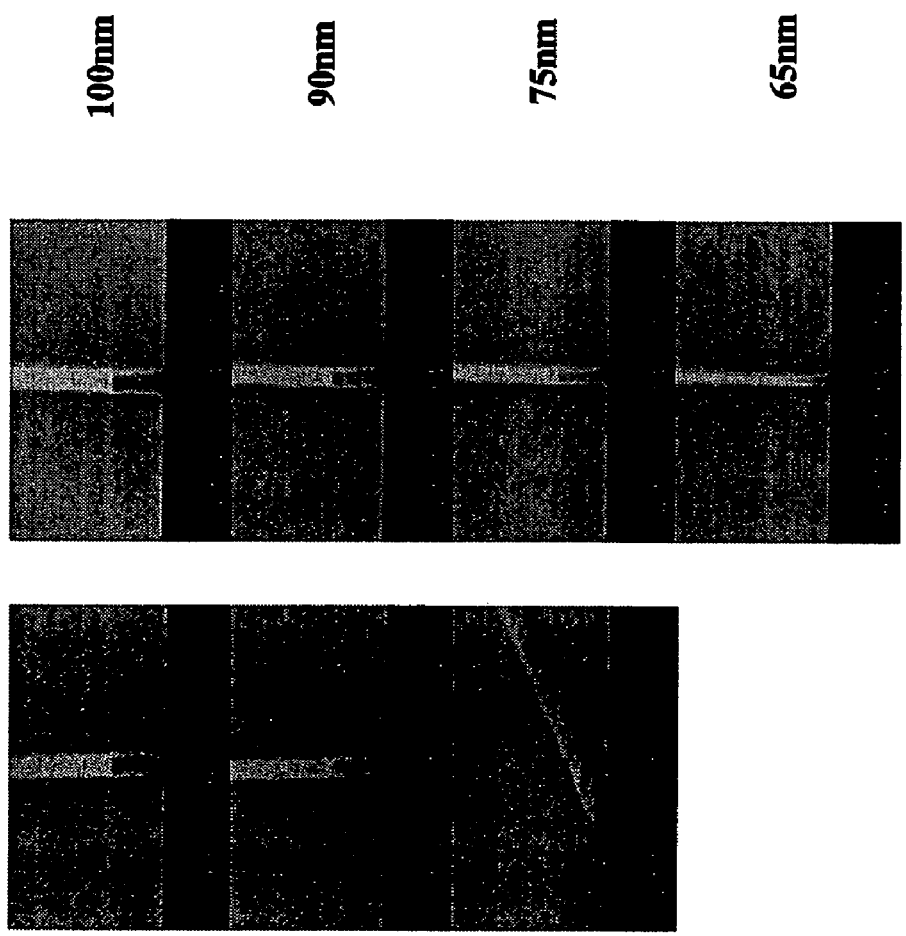
FIG. 3 is scanning electron microscope photographs on limiting resolution according to Example 1 of the present invention and Comparative Example 1.

The resolution was evaluated according to the method described below. The solutions obtained in Examples 1 to 3 and Comparative Example 1 were coated on silicon wafers by means of a spinner. The coated silicon wafers were heated at 205°C. for 1 minute on a hot plate to form anti-reflective coatings (film thickness 0.078 μm). On each anti-reflective coating for lithography was coated a commercially available resist solution (trade name: PAR705 manufactured by Sumitomo Chemical Co., Ltd.) by means of a spinner. The coated wafers were heated at 90° C. for 1 minute on a hot plate to form photoresist coatings (film thickness 0.33 μm). These coatings were exposed to light by using PAS 5500/990 Scanner manufactured by ASML Inc., (a wavelength of 193 nm, NA, σ: 0.63, 0.87/0.57 (Annular) through a mask by which isolated lines (line-width 100, 90, 75 or 65 nm) would be formed on a photoresist after development. Thereafter, the development was carried out in a similar manner as above. Then, the limiting resolution of isolated lines was evaluated. When upright lines were formed in a specimen, the specimen was judged to be passed, on the other hand when lines were fallen, the specimen was judged to be failed. The results in each specimen are shown in Table 1. In addition, FIG. 3 shows scanning electron microscope photographs of Example 1 and Comparative Example 1. From FIG. 3, it is clear that lines of a resist pattern to 65 nm were isolated, that is, a resolution is to 65 nm in Example 1 according to the present invention. On the contrary, it is clear that a resolution is only to 90 nm in Comparative Example 1. In addition, any line patterns of resists obtained in this test had fine foot shape.

TABLE 1

|  | Refractive index (n) | Attenuation coefficient (k) | Margin of depth of focus (μm) | Limiting resolution (nm) | Foot form of resist |
|---|---|---|---|---|---|
| Example 1 | 1.82 | 0.34 | 0.9 | 65 | Straight |
| Example 2 | 1.82 | 0.34 | 0.9 | 65 | Straight |
| Example 3 | 1.82 | 0.34 | 0.8 | 65 | Straight |
| Example 4 | 1.74 | 0.59 | 0.6 | — | Straight |
| Example 5 | 1.53 | 0.49 | 1.1 | — | Straight |
| Comparative Example 1 | 1.82 | 0.34 | 0.5 | 90 | Straight |
| Comparative Example 2 | 1.80 | — | — | — | — |

It is understood that anti-reflective coatings obtained from the anti-reflective coating compositions of the present invention afford fully broad margin of depth of focus and fully high limiting resolution. For example, it was confirmed that the anti-reflective coating of Example 1 according to the present invention in which a resin having a lactone structure is contained afforded broader margin of depth of focus and higher limiting resolution compared with the anti-reflective coating of Comparative Example 1 in which a resin having no lactone structure. It is understood that the anti-reflective coatings obtained from the compositions of the present invention have broad margin of depth of focus and high limiting resolution against irradiated light for exposure of 193 nm or 248 nm while maintaining practical refractive index and attenuation coefficient.

INDUSTRIAL APPLICABILITY

The present invention provides compositions from which anti-reflective coatings with broad margin of depth of focus and high resolution can be formed. The obtained anti-reflective coatings are not only excellent in an effect for reducing reflection from a substrate but also effective for improving a degree of adhesion with a photoresist.

The present invention can provide a composition for forming an anti-reflective coating which has a high degree of adhesion with an unexposed portion of a resist layer and an excellent effect for reducing reflection, and further causes no intermixing with a resist layer nor diffusion into the resist during drying under heating, and has a high resolution and an excellent film thickness-dependence; and a method for forming an excellent resist pattern.

What is claimed is:

1. A composition for forming anti-reflective coating for use in a lithographic process in manufacture of a semiconductor device, comprising a resin having a lactone structure, and a crosslinking agent, wherein the resin is a resin in which a γ-lactone structure is introduced to a main chain thereof or a side chain bonded to the main chain.

2. The composition for forming anti-reflective coating according to claim 1, wherein the resin has a structural unit of formula (1):

Formula (1)

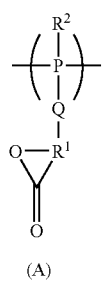

(A)

wherein Q is a divalent linking group through which P and $R^1$ are linked, $R^1$ is a substituted or unsubstituted propylenyl or butylenyl, P is a linking group constituting the main chain, and $R^2$ is a hydrogen atom, methyl or a halogen atom.

3. The composition for forming anti-reflective coating according to claim 1, wherein the resin is composed of a polymer of formula (2):

Formula (2)

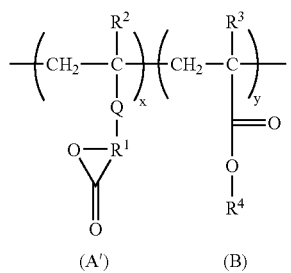

wherein x and y is the number of repeating units, x is 5 to 5,000, y is 2 to 5,000, Q is a divalent linking group through which a carbon atom constituting the main chain and $R^1$ are linked, $R^1$ is a substituted or unsubstituted propylenyl or butylenyl, $R^2$ and $R^3$ are a hydrogen atom, methyl or a halogen atom, and $R^4$ is a hydrogen atom, a substituted or unsubstituted alkyl group having 1 to 10 carbon atoms, a substituted or unsubstituted aralkyl group, a substituted or unsubstituted carbocyclic aromatic group, or a substituted or unsubstituted heterocyclic aromatic group, structural unit (A') is in an amount of 1 to 76 mol % and structural unit (B) is in an amount of 99 to 24 mol %.

4. The composition for forming anti-reflective coating according to claim 1, wherein the resin is composed of a polymer of formula (3):

Formula (3)

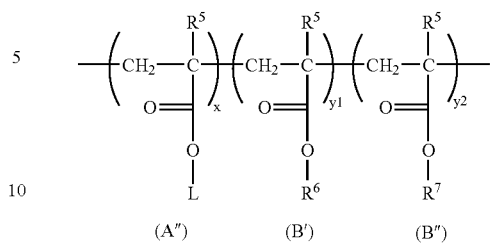

wherein x, y1 and y2 are the number of repeated units, x is 5 to 5,000, y1 and y2 are 1 or more and the sum of y1 and y2 is 2 to 5,000, $R^5$ is a hydrogen atom or methyl, $R^6$ is hydroxyethyl or hydroxypropyl, $R^7$ is phenyl, benzyl, naphthyl, anthryl or anthrylmethyl, and L is (L-1) or (L-2) described below (L-1)

(L-2)

structural unit (A″) is in an amount of 1 to 76 mol % and structural units (B′) and (B″) are in an amount of 1 mol % or more and the sum of (B′) and (B″) is 99 to 24 mol %.

5. The composition for forming anti-reflective coating according to claim 1, wherein the resin has a structure with an absorption at 248 nm, 193 nm or 157 nm.

6. The composition for forming anti-reflective coating according to claim 1, wherein the crosslinking agent has at least two crosslink-forming functional groups.

7. A method of forming an anti-reflective coating for use in a lithographic process in a manufacture of a semiconductor device, comprising the steps of; coating the composition according to claim 1 on a substrate, and baking it.

8. A process for manufacturing a semiconductor device comprising the steps of:
coating the composition according to claim 1 on a substrate and baking it to form an anti-reflective coating,
covering the anti-reflective coating with a photoresist,
exposing the substrate covered with the anti-reflective coating and the photoresist to light,
developing the exposed substrate, and
transferring an image on the substrate by dry etching to form an integrated circuit element.

9. The process for manufacturing a semiconductor device according to claim 8, wherein the exposure is carried out with light having a wavelength of 193 nm.

* * * * *